United States Patent [19]
Ecker et al.

[11] Patent Number: 6,058,025
[45] Date of Patent: May 2, 2000

[54] COMPUTER TAILGATE HAVING EXPANSION SLOT ALIGNMENT PINS

[75] Inventors: Richard M. Ecker, Poughkeepsie; Franz Edlinger, Margaretville; Peter W. Kelly, Stone Ridge, all of N.Y.

[73] Assignee: International Business Machines Corporation, Armonk, N.Y.

[21] Appl. No.: 09/063,991

[22] Filed: Apr. 21, 1998

[51] Int. Cl.[7] .................................................. H05K 9/00
[52] U.S. Cl. .......................... 361/816; 361/753; 361/756; 361/796; 361/818; 174/35 R
[58] Field of Search .................................. 361/800, 801, 361/802, 816, 825, 796, 756, 753; 174/35 R, 35 GC, 35 TS, 51; 439/61, 607; 206/706, 709, 711, 722, 725; 211/41.17

[56] References Cited

U.S. PATENT DOCUMENTS

| | | | |
|---|---|---|---|
| 4,664,265 | 5/1987 | George, Jr. ................................. | 211/41 |
| 4,744,006 | 5/1988 | Duffield ................................... | 361/414 |
| 4,745,524 | 5/1988 | Patton, III ............................... | 361/399 |
| 4,873,395 | 10/1989 | Mast ........................................ | 174/35 |
| 4,971,563 | 11/1990 | Wells, III ................................. | 439/61 |
| 4,979,075 | 12/1990 | Murphy ................................... | 361/399 |
| 5,004,867 | 4/1991 | Mast ........................................ | 174/35 |
| 5,544,006 | 8/1996 | Radloff et al. .......................... | 361/683 |
| 5,564,930 | 10/1996 | Yu ............................................ | 439/61 |
| 5,575,546 | 11/1996 | Radloff ................................... | 213/183 |
| 5,594,627 | 1/1997 | Le ........................................... | 361/801 |
| 5,601,349 | 2/1997 | Holt ........................................ | 312/265.6 |
| 5,640,309 | 6/1997 | Carney et al. .......................... | 361/801 |
| 5,650,922 | 7/1997 | Ho .......................................... | 361/799 |
| 5,652,697 | 7/1997 | Le ........................................... | 361/788 |
| 5,686,695 | 11/1997 | Chan ....................................... | 174/35 |
| 5,856,632 | 1/1999 | Bostrom et al. ........................ | 174/35 GC |

*Primary Examiner*—Donald Sparks
*Assistant Examiner*—Jayprakash N. Gandhi
*Attorney, Agent, or Firm*—Floyd A. Gozalez

[57] ABSTRACT

A tailgate assembly of a computer including a tailgate member having a plurality of slots behind which may be positioned removable expansion boards, and an EMC gasket between the tailgate member and the expansion boards. An alignment pin projects from the tailgate member on each side of each slot. The alignment pins on each side of each slot guide the expansion board into place as it is being positioned behind one of the slots and prevents the EMC gasket from sliding out of position.

5 Claims, 3 Drawing Sheets

COMPUTER TAILGATE HAVING EXPANSION SLOT ALIGNMENT PINS

The present invention relates to expansion slot alignment pins, and more particularly relates to alignment pins used to align expansion cards in the tailgate of a computer.

BACKGROUND OF THE INVENTION

Computers are known in which tailgates are provided for allowing expansion boards such as Peripheral Component Interconnect (PCI) boards to be added to allow peripherals to be added to the computer. ElectroMagnetic Compatibility (EMC) gaskets are also known which may be used with computer tailgates. However, EMC gaskets are loosely held in place, and must be aligned with the PCI boards as they are being added. If more than a few boards are being added, it is very difficult to align the board for proper installation in the computer, align the EMC gasket with all of the boards, and fasten the boards in place, typically with screws, while maintaining all of the boards and the EMC gasket in proper alignment, without damage to the EMC gasket.

Arrangements for providing for the addition of circuit boards to an enclosure, or for sealing an enclosure from the emission of electromagnetic interference is shown in the following patents: U.S. Pat. No. 5,686,695 issued Nov. 11, 1997 to Chan for RESILIENT PLATE FOR A COMPUTER INTERFACE CARD; U.S. Pat. No. 5,652,697 issued Jul. 29, 1997 to Le for COMPUTER SYSTEM BLACKPLANE HAVING GROUND TABS FOR INTERCONNECTING THE BACKPLANE GROUND TO THE COMPUTER SYSTEM CHASSIS; U.S. Pat. No. 5,640,309 issued Jun. 17, 1997 to Carney et al. for PCI EXPANSION CARD RETAINER CLIP; U.S Pat. No. 5,601,349 issued Feb. 11, 1997 to Holt for CAPTIVE LATCH MECHANISM FOR USE WITH AN EXPANSION CARD CAGE IN A PERSONAL COMPUTER; U.S. Pat. No. 5,594,627 issued Jan. 14, 1997 to Le for CIRCUIT CARD RETAINER; U.S. Pat. No. 5,575,546 issued Nov. 19, 1996 to Radloff for APPARATUS FOR RETENTION OF COMPUTER EXPANSION CARDS AND FILLER PANELS; U.S. Pat. No. 5,650,922 issued Jul. 22, 1997 to Ho for COMPUTER INTERFACE CARD MOUNTING STRUCTURE; U.S. Pat. No. 5,640,309 issued Jun. 17, 1997 to Carney et al. for PCI EXPANSION CARD RETAINED CLIP; U.S. Pat. No. 5,564,930 issued Oct. 15, 1996 to Yu for MODULAR COMPUTER CASE; U.S. Pat. No. 5,544,006 issued Aug. 6, 1996 to Radloff et al. for COMPUTER CHASSIS HAVING FLEXIBLE CARD GUIDE FOR EXPANSION CARD INSERTION AND REMOVAL; U.S. Pat. No. 5,004,867 issued Apr. 2, 1991 to Mast for PERSONAL COMPUTER EXPANSION SLOT SEAL AND METHOD; U.S. Pat. No. 4,979,075 issued Dec. 18, 1990 to Murphy for METHOD AND APPARATUS FOR CONTROLLING CIRCUIT EXPANSION FOR CONSUMER ELECTRONIC SYSTEMS; U.S. Pat. No. 4,971,563 issued Nov. 20, 1990 to Wells, III for MODULAR BACKPLANE ASSEMBLIES FOR COMPUTERS; U.S. Pat. No. 4,873,395 issued Oct. 10, 1989 to Mast for PERSONAL COMPUTER EXPANSION SLOT SEAL AND METHOD; U.S. Pat. No. 4,745,524 issued May 17, 1988 to Patton, III for MOUNTING OF PRINTED CIRCUIT BOARDS IN COMPUTERS; U.S. Pat. No 4,744,006 issued May 10, 1988 to Duffield for APPARATUS FOR EXPANDING THE INPUT/OUTPUT CAPABILITIES OF A PERSONAL COMPUTER; and U.S. Pat. No. 4,664,265 issued May 12, 1987 to CIRCUIT BOARD CARRIER.

SUMMARY OF THE INVENTION

A tailgate assembly of a computer is disclosed which include a tailgate member having a plurality of slots behind which may be positioned removable expansion boards, and an EMC gasket between the tailgate member and the expansion boards. An alignment pin projects from the tailgate member on each side of each slot. The alignment pins guide the expansion board into place as it is being positioned behind one of the slots and prevents the EMC gasket from sliding out of position.

It is thus a primary object of the present invention to provide alignment pins on a computer tailgate in which the alignment pins hold an ElectroMagnetic Compatibility (EMC) in place and assist in guiding expansion boards such as Peripheral Component Interconnect (PCI) boards into place in the tailgate.

It is another object of the invention to provide and EMC gasket which may be used with a tailgate having aligning pins to assist in guiding PCI boards into place in the tailgate.

The foregoing and other objects, features and advantages of the invention will be apparent from the following more particular description of the preferred embodiment of the invention as illustrated in the drawings.

DETAILED DESCRIPTION OF THE PREFERRED EMBODIMENT

Figure 1:
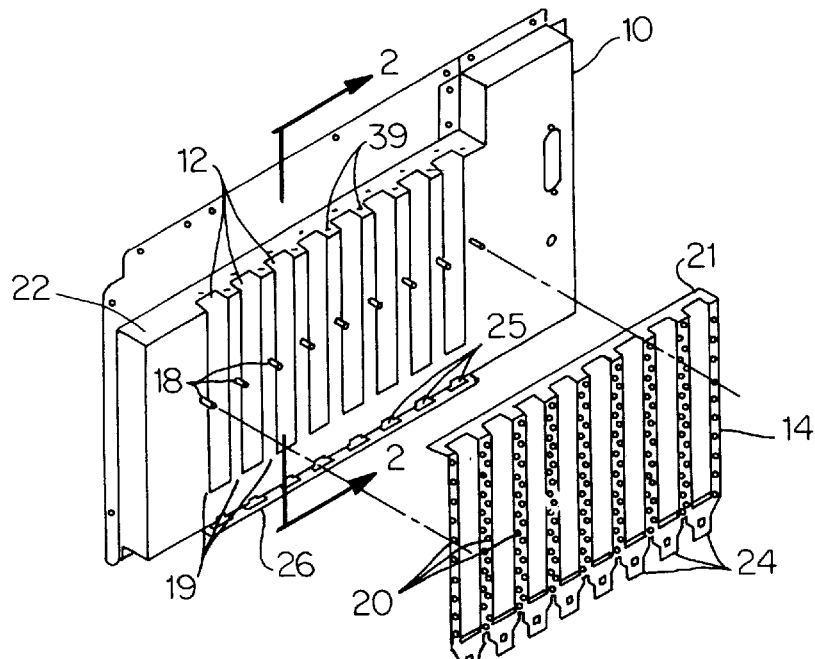
FIG. 1 is a perspective exploded view of a tailgate of a computer having alignment pins on which may be positioned an EMC shield.

FIG. 1 is a perspective view of a tailgate 10 of a computer system. The tailgate 10 has a plurality of slots 12 behind which may be placed computer expansion boards such as Peripheral Component Interconnect (PCI) adapter boards to allow computer peripherals to be connected to the computer, as is well understood in the art. Typically, an Electromagnetic Compatibility (EMC) shield 14 is positioned on the inside of the tailgate. The EMC shield is made of stamped sheet steel, as is known. The EMC shield has slots 16 corresponding to the slots 12 of the tailgate, and when the EMC shield 14 is in place, the slots 16 are in register with the slots 12 to allow peripheral cables to be connected through the slots to connectors in the edges of the PCI boards, also as well known. The tailgate 12 includes alignment pins 18 projecting from the spaces 19 between the slots 12. The alignment pins are received by corresponding holes 20 in the EMC shield 14. The top of the EMC shield 14 is bent over to form a flat 21 for positioning on an edge 22 provided on the tailgate 10. The bottom of the EMC shield 14 includes a plurality of tabs 24 which fit into corresponding slots 25 in a positioning strip 26 projecting from the tailgate 10.

In one embodiment, the present invention is incorporated in a computer having a modular enclosure assembled in accordance with U.S. patent application Ser. No. 09/063,990 to Ayd et al. for MODULAR NODE ASSEMBLY FOR RACK MOUNTED MULTIPROCESSOR COMPUTER (Attorney Docket No. (PO9-97-160); the chassis of enclosure are joined in accordance with U.S. patent application Ser. No. 09/063,836 to Ayd et al. for CAMMING MECHA- NISM FOR JOINING MODULAR ELECTRONIC ENCLOSURES (Attorney Docket No. PO9-97-174); the chassis of the computer enclosure are slidably engageable in accordance with U.S. patent application Ser. No. 09/063,989 to Ecker el al. for ABRASION CONTROL ON SLIDING ASSEMBLIES (Attorney Docket No. PO9-98-059); and cooling air is distributed in the enclosure in accordance with U.S. patent application Ser. No. 09/063,850 to Delia et al. for CONSTANT IMPEDANCE AIR BAFFLE FOR COOLING OF ELECTRONIC CARD ASSEMBLIES (Attorney Docket No. PO9-97-161); all of which are owned by the assignee of the present invention and incorporated herein by reference.

Figure 2:
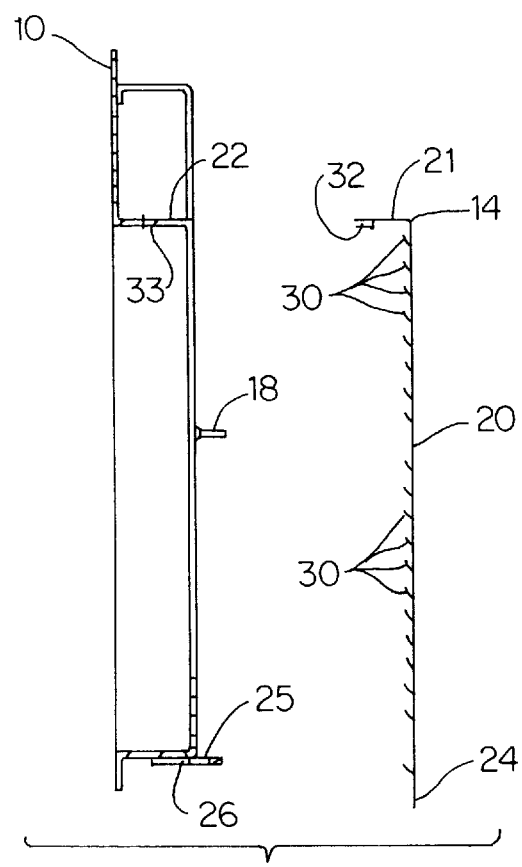
FIG. 2 is an elevational view taken along section line 2—2 of FIG. 1.

Turning now to FIG. 2, the EMC shield 14 includes a plurality of cutouts which have been bent inwardly to form a plurality of contact fingers 30 which, when the EMC shield 14 is in place, come in contact with the tailgate. A portion of the EMC shield 14 which has been cut out to form the slots 16 has been folded back to form the clips 32. The clips 32 clip over edges 33 of the tailgate 10 exposed by the slots 12. The EMC shield 14 is installed by inserting the tabs 24 into the slots 25, and clipping the clips 32 over the edges 33, and receiving the alignment pins 18 in the corresponding holes 20. Thus, the EMC shield is firmly held in place, and cannot slide in any direction, when installed in the tailgate 10.

Figure 3:
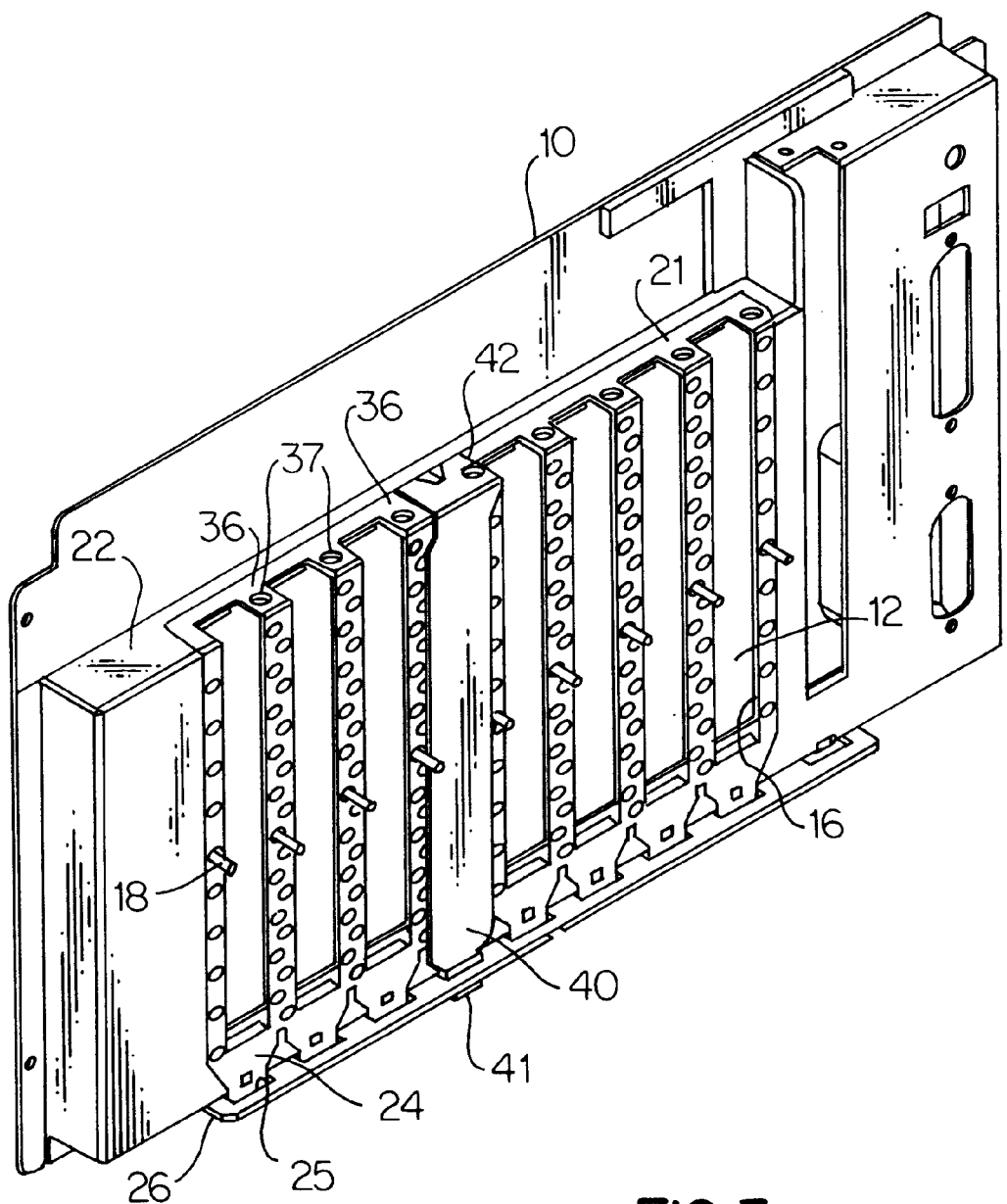
FIG. 3 is a perspective view of the tailgate of FIG. 1 with the EMC shield in place over the alignment pins.

Turning now to FIG. 3, the EMC shield 14 is shown in place on the tailgate 10, the portions 36 of the flat 21 between the slots 16 have holes 37 which are in register with screw holes 39 (see FIG. 1) in the edge 22 of the tailgate. Blank face plates 40 are placed over those slots 12 in the tailgate which are not used by PCI boards, as will be explained. The blank face plate 40 includes tabs 41 which fit into slots 25 over the tabs 24. The blank face plate 40 also includes a screw hole 42 which may be positioned over the hole 37 and screw hole 39, to receive a screw (not shown) and hold the blank face plate 40 and EMC shield 14 in place.

Figure 4:
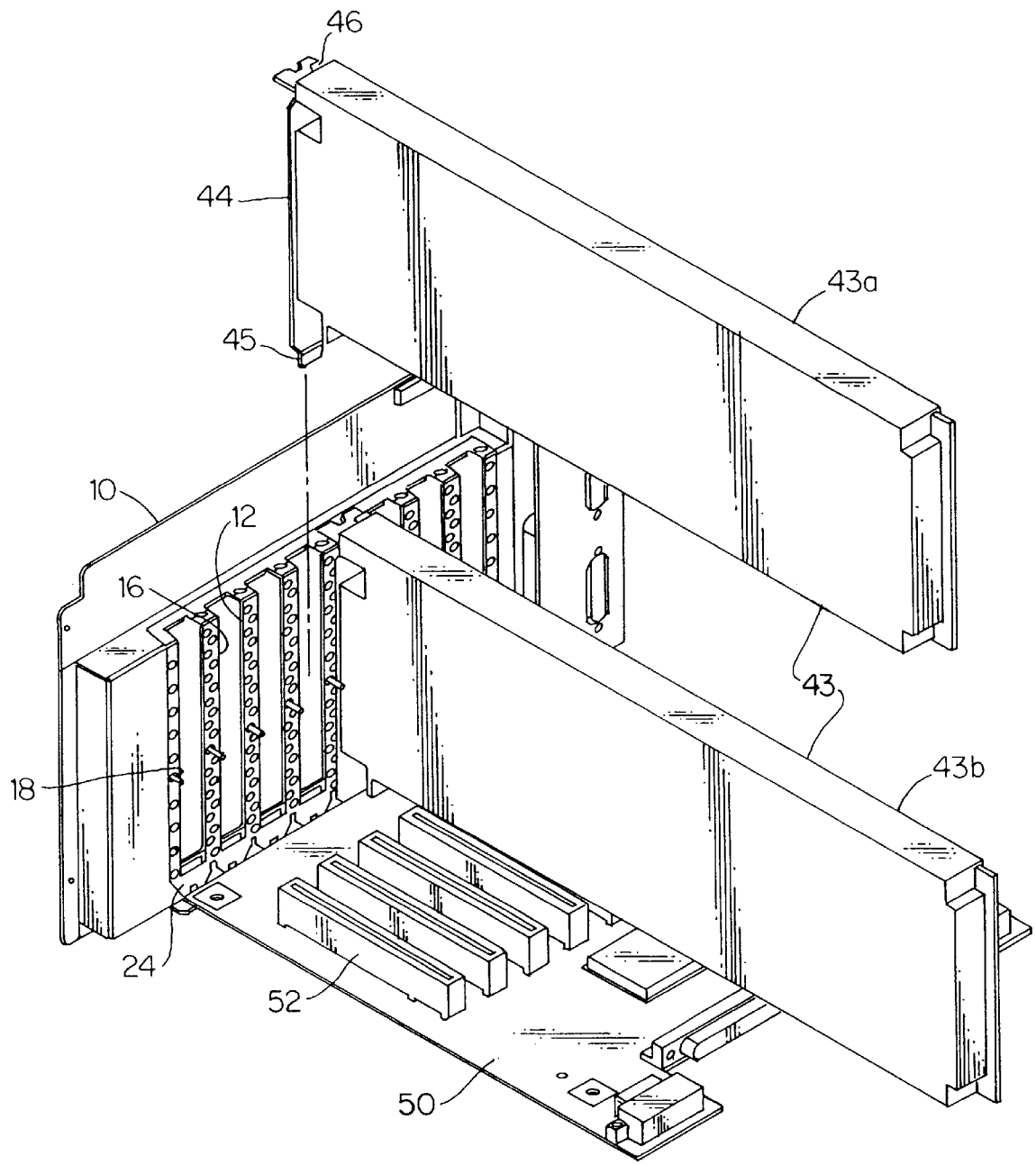
FIG. 4 is a perspective view of the tailgate of FIG. 1 with a motherboard attached, and showing the alignment pins being used to align PCI adapter cards.

FIG. 4 is a perspective view of the tailgate 10 with a motherboard 50 as it would appear in a computer. The motherboard 50 includes connectors 52 in which PCI cards 43 are connected. It will be understood that the connectors 52 are lined up behind the slots 12 such that when a PCI card is connected in a connector 52, the edge 44 of the PCI card 43 is in the slot 12. Each PCI card includes a tab 45 which fits into slot 25 over tab 24, and a hole 46 which may be placed over holes 37 and 39 for receiving a screw or other fastener to hold the PCI board in place. As can be seen in FIG. 4, the alignment pins 18 are used to guide the PCI board 43a as it is being installed over the slots 12 and 16. The alignment pins 18 hold the EMC shield 14 in place, align the edges of the PCI board 43 as it is being slid in place, and greatly facilitate the assembly of the PCI boards 43 with the tailgate 10. For those slots 12 which do not receive a board 43, the empty slots are covered by blank face plates 40 to complete the assembly of the computer with proper EMC shielding in place.

Even though the present embodiment uses PCI boards, it will be understood that any expansion board may be used. Further, it will be understood that the blank face plates 40 and boards 43 may be secured to the tailgate by any fastening means instead of the screws mentioned.

While we have illustrated and described the preferred embodiment of our invention, it is to be understood that we do not limit ourselves to the precise construction herein disclosed, and the right is reserved to all changes and modifications coming within the scope of the invention as defined in the appended claims.

Having thus described our invention, what we claim as new, and desire to secure by Letters Patent is:

1. A tailgate assembly comprising:

a tailgate member having a slot therethrough;

alignment pins projecting from said tailgate member, one on each side of said slot;

an ElectroMagnetic Compatibility (EMC) shield member having a slot in register with the slot through said tailgate member, said EMC shield further having holes therein for receiving said alignment pins such that said EMC shield may lie flat against said tailgate member; and an expansion board movable over said slot in said tailgate member, said expansion board having an edge, a portion of said edge being exposed by the slot in said tailgate member in register with a corresponding slot in said EMC shield, said expansion board further being aligned between said alignment pins and trapping a portion of said EMC shield between said edge and said tailgate member as said expansion board is moved into place.

2. The tailgate assembly of claim 1 wherein said tailgate member has a plurality of slots, each slot having an alignment pin on two sides thereof, and said EMC shield has a plurality of slots, each in register with one of said slots in said tailgate member, said EMC shield further having holes therethrough for receiving said alignment pins such that said EMC shield cannot slide out of position as expansion boards are moved into position over said registered slots.

3. The tailgate assembly of claim 2 further comprising fastening means at each end of said registered slots for securing said expansion board to said tailgate member with a portion of said EMC shield trapped therebetween.

4. The tailgate assembly of claim 3 wherein said fastening means comprises a tab in said expansion board having a hole therein, said EMC shield has a hole therein in register with the hole in said expansion board, said tailgate member has a screw hole in register with said holes in said EMC shield and said expansion board, and a screw through said holes in said EMC shield and said expansion board and screwed into said screw hole.

5. The tailgate assembly of claim 3 wherein said fastening means comprises a strip on one end of the slots of said tailgate member, said strip having a tab receiving slot therein, said EMC shield has a tab on one end for extending through said tab receiving slot, and said expansion board has a tab for extending through said tab receiving slot such that the tab on the EMC shield is trapped between the tab on the extension board and the tailgate member.

* * * * *